(12) United States Patent
Paseuth et al.

(10) Patent No.: US 10,166,611 B2
(45) Date of Patent: Jan. 1, 2019

(54) SURFACE-COATED CUTTING TOOL AND METHOD OF PRODUCING THE SAME

(71) Applicant: SUMITOMO ELECTRIC HARDMETAL CORP., Itami-shi (JP)

(72) Inventors: Anongsack Paseuth, Sorachi-gun (JP); Satoshi Ono, Sorachi-gun (JP); Hideaki Kanaoka, Sorachi-gun (JP); Shinya Imamura, Sorachi-gun (JP)

(73) Assignee: SUMITOMO ELECTRIC HARDMETAL CORP., Itami-shi (JP)

( * ) Notice: Subject to any disclaimer, the term of this patent is extended or adjusted under 35 U.S.C. 154(b) by 41 days.

(21) Appl. No.: 15/324,894

(22) PCT Filed: Jun. 22, 2016

(86) PCT No.: PCT/JP2016/068500
§ 371 (c)(1),
(2) Date: Jan. 9, 2017

(87) PCT Pub. No.: WO2017/175400
PCT Pub. Date: Oct. 12, 2017

(65) Prior Publication Data
US 2018/0178294 A1 Jun. 28, 2018

(30) Foreign Application Priority Data
Apr. 8, 2016 (JP) ................................ 2016-078297

(51) Int. Cl.
C23C 16/34 (2006.01)
B23B 51/00 (2006.01)
(Continued)

(52) U.S. Cl.
CPC .............. B23B 51/00 (2013.01); B23B 27/14 (2013.01); C23C 16/0272 (2013.01);
(Continued)

(58) Field of Classification Search
USPC .......... 51/307, 309; 428/336, 697, 698, 699; 427/255, 255.23, 255.28, 255.36, 255.39,
(Continued)

(56) References Cited

U.S. PATENT DOCUMENTS 6,250,855 B1 * 6/2001 Persson .................... C22C 29/08
407/118
6,309,738 B1 * 10/2001 Sakurai ............... C23C 14/0641
428/697

(Continued)

FOREIGN PATENT DOCUMENTS

JP 2007-203447 * 8/2007
JP 2014-024130 A 2/2014

(Continued)

OTHER PUBLICATIONS

Ikeda et al., "Phase Formation and Characterization of Hard Coatings in the Ti—Al—N System Prepared by the Cathodic Arc Ion Plating Method," Thin Solid Films 195 (1991) pp. 99-110.

(Continued)

*Primary Examiner* — Archene A Turner
(74) *Attorney, Agent, or Firm* — Venable LLP; Michael A. Sartori; Kerri M. Patterson

(57) ABSTRACT

A cutting tool includes a base material and a coating formed on the base material. The coating includes a hard layer. The hard layer includes a plurality of crystal grains having a sodium chloride-type crystal structure. When the angle of intersection between the normal direction to (001) plane that is a crystal plane of the crystal grain and the normal direction to the surface of the base material is measured, a proportion A of the crystal grains having the angle of intersection of 0 degree or more to less than 20 degrees is 50% or more. The length of Σ3 grain boundaries is 50% or more of the length of Σ3-29 grain boundaries and is 1% or more and 30% or less of the total length of all boundaries that is the sum of the (Continued)

length of Σ3-29 grain boundaries and the length of general boundaries.

6 Claims, 4 Drawing Sheets

(51) Int. Cl.
| | |
|---|---|
| B23B 27/14 | (2006.01) |
| C23C 16/02 | (2006.01) |
| C23C 16/36 | (2006.01) |
| C23C 16/56 | (2006.01) |
| C30B 28/14 | (2006.01) |
| C30B 29/38 | (2006.01) |
| C30B 29/68 | (2006.01) |
| C23C 16/40 | (2006.01) |

(52) U.S. Cl.
CPC .............. *C23C 16/34* (2013.01); *C23C 16/36* (2013.01); *C23C 16/403* (2013.01); *C23C 16/56* (2013.01); *C30B 28/14* (2013.01); *C30B 29/38* (2013.01); *C30B 29/68* (2013.01); *B23B 2251/50* (2013.01)

(58) Field of Classification Search
USPC ..................................... 427/255.391, 255.394
See application file for complete search history.

(56) References Cited

U.S. PATENT DOCUMENTS

| | | | |
|---|---|---|---|
| 2002/0051887 A1* | 5/2002 | Jonsson | .................. C22C 29/08 427/255.28 |
| 2016/0053372 A1 | 2/2016 | Stiens et al. | |
| 2017/0113285 A1* | 4/2017 | Tatsuoka | ............... C23C 28/042 |
| 2017/0297117 A1* | 10/2017 | Tatsuoka | ............... B23B 27/148 |

FOREIGN PATENT DOCUMENTS

| | | |
|---|---|---|
| JP | 2015-193071 A | 11/2015 |
| JP | 2016-003369 A | 1/2016 |
| JP | 5871353 B1 | 3/2016 |
| WO | 2015/174490 A1 | 11/2015 |
| WO | 2016/047581 A1 | 3/2016 |

OTHER PUBLICATIONS

Setoyama et al., "Formation of cubic-AlN in TiN/AlN superlattice," Surface & Coatings Technology 86-87 (1996) pp. 225-230.
International Search Report in counterpart International Application No. PCT/JP2016/068500, dated Aug. 9, 2016.
Office Action issued in U.S. Appl. No. 14/654,937 dated Nov. 8, 2018.

* cited by examiner

SURFACE-COATED CUTTING TOOL AND METHOD OF PRODUCING THE SAME

TECHNICAL FIELD

The present invention relates to a surface-coated cutting tool and a method of producing the same. This application claims the priority of Japanese Patent Application No. 2016-078297 filed on Apr. 8, 2016, the entire contents of which are hereby incorporated by reference.

BACKGROUND ART

Cutting tools formed of cemented carbide have cutting edges exposed to severe environments such as high temperatures and high loads during cutting work, and the cutting edges are often worn or chipped. Coatings that cover the surfaces of base materials such as cemented carbide have been developed for the purpose of improving cutting performance of the cutting tools. Among others, coatings made of compounds of titanium (Ti) and aluminum (Al) with both or one of nitrogen (N) and carbon (C) (hereinafter also referred to as AlTiN, AlTiCN, and the like) can have high hardness, and it is known that increasing the Al content improves oxidation resistance. Improvement in performance of cutting tools is expected by covering the cutting tools with such coatings.

Unfortunately, Ikeda et al. (Non-Patent Document 1) indicates that when an "AlTiN" or "AlTiCN" coating with an atomic ratio of Al exceeding 0.7 is produced by physical vapor deposition (PVD), the layer structure of the coating changes to the wurtzite crystal structure, resulting in reduction of hardness. Setoyama et al. (Non-Patent Document 2) produced a super multilayer film of TiN/AlN by PVD in order to increase an Al content in an "AlTiN" or "AlTiCN" coating. However, it is reported that when an "AlTiN" or "AlTiCN" coating with a thickness exceeding 3 nm per AlN layer is produced, the layer structure changes to the wurtzite crystal structure, resulting in reduction of hardness.

Studies then have been made to increase the Al content by chemical vapor deposition (CVD). For example, Japanese Patent Laying-Open No. 2015-193071 (Patent Document 1) discloses a hard coating layer formed by CVD. This hard coating layer includes a composite nitride layer or a composite carbonitride layer represented by $(Ti_{1-x}Al_x)(C_yN_{1-y})$, in which the layer includes crystal grains having a cubic structure, and the composition of Ti and Al periodically varies along the normal direction to the surface of the tool base material.

CITATION LIST

Patent Document

PTD 1: Japanese Patent Laying-Open No. 2015-193071

Non Patent Document

NPD 1: T. Ikeda et al., "Phase formation and characterization of hard coatings in the Ti—Al—N system prepared by the cathodic arc ion plating method", Thin Solid Films 195 (1991) 99-110
NPD 2: M. Setoyama et al., "Formation of cubic-AlN in TiN/AlN superlattice", Surface & Coatings Technology 86-87 (1996) 225-230

SUMMARY OF THE INVENTION

A surface-coated cutting tool according to an aspect of the present invention includes a base material and a coating formed on the base material. The coating includes a hard layer. The hard layer includes a plurality of crystal grains having a sodium chloride-type crystal structure. When the crystal orientation of each of a plurality of crystal grains is analyzed using an electron backscatter diffraction system for a cross section of the hard layer that is parallel to the normal direction of the surface of the base material to measure an angle of intersection between the normal direction to (001) plane that is a crystal plane of the crystal grain and the normal direction to the surface of the base material, a proportion A of the crystal grains having the angle of intersection of 0 degree or more to less than 20 degrees is 50% or more. The boundaries of the crystal grains include CSL boundaries and general boundaries. The length of Σ3 grain boundaries of the CSL boundaries is 50% or more of the length of Σ3-29 grain boundaries that is a total of respective lengths of Σ3 grain boundaries, Σ7 grain boundaries, Σ11 grain boundaries, Σ17 grain boundaries, Σ19 grain boundaries, Σ21 grain boundaries, Σ23 grain boundaries, and Σ29 grain boundaries included in the CSL boundaries and is 1% or more and 30% or less of the total length of all boundaries that is the sum of the length of Σ3-29 grain boundaries and the length of general boundaries. The crystal grain has a layered structure in which a first layer composed of nitride or carbonitride of $Al_xTi_{1-x}$ and a second layer composed of nitride or carbonitride of $Al_yTi_{1-y}$ (where x≠y) are alternately stacked. The total thickness of the first layer and the second layer adjacent to each other is 3 nm or more and 30 nm or less.

According to an aspect of the present invention, a method of producing the surface-coated cutting tool as described above is provided. The method includes: a first step of preparing the base material; and a second step of forming the hard layer by chemical vapor deposition (CVD). The second step includes a step of modulating a flow rate of both or one of $AlCl_3$ gas and $TiCl_4$ gas.

DESCRIPTION OF EMBODIMENTS

Figure 1:
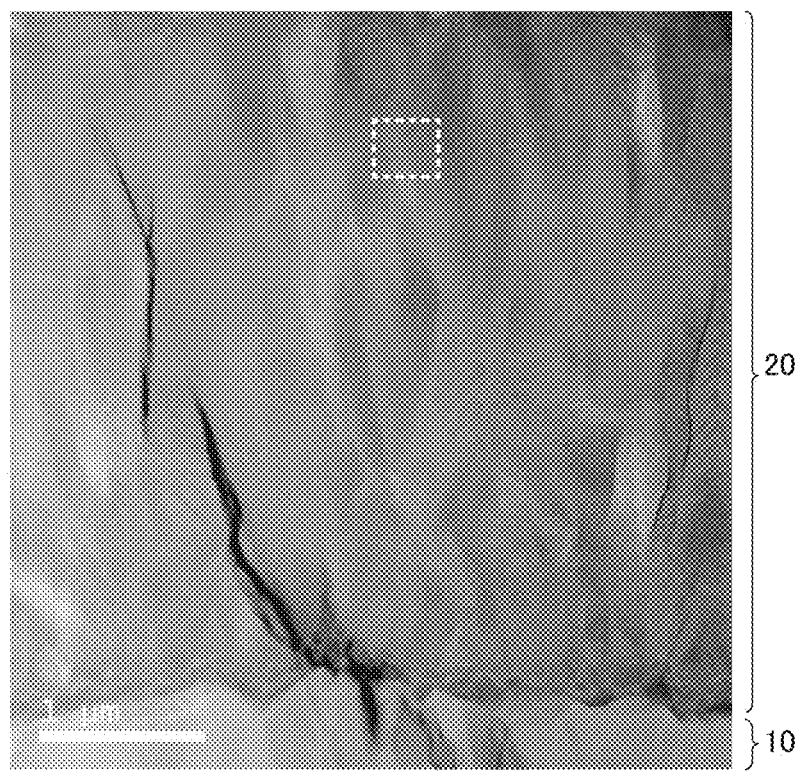
FIG. 1 is a photograph of a microscopic image of a cross section of a coating in a surface-coated cutting tool.

[Problems to be Solved by the Present Disclosure]

According to Patent Document 1, the composite nitride layer or the composite carbonitride layer has a cubic structure and the composition of Ti and Al varies periodically along the normal direction to the base material, whereby the resulting hard coating layer has high hardness and excellent toughness. This hard coating layer, however, has room for improvement in particular in chipping resistance. The desired long life based on both of high wear resistance and high chipping resistance is not yet achieved, and there has been a strong demand for development in this regard.

The present invention is made in view of the situation above, and an object of the present invention is to provide a surface-coated cutting tool having high wear resistance and high chipping resistance, and a method of producing the same.

[Effects of the Present Disclosure]

According to the foregoing description, a surface-coated cutting tool having high wear resistance and high chipping resistance can be provided.

[Description of Embodiments of the Present Invention]

First of all, embodiments of the present invention are listed below.

[1] A surface-coated cutting tool according to an aspect of the present invention includes a base material and a coating formed on the base material. The coating includes a hard layer. The hard layer includes a plurality of crystal grains having a sodium chloride-type crystal structure. When the crystal orientation of each of a plurality of crystal grains is analyzed using an electron backscatter diffraction system for a cross section of the hard layer that is parallel to the normal direction of the surface of the base material to measure an angle of intersection between the normal direction to (001) plane that is a crystal plane of the crystal grain and the normal direction to the surface of the base material, a proportion A of the crystal grains having the angle of intersection of 0 degree or more to less than 20 degrees is 50% or more. The boundaries of the crystal grains include CSL boundaries and general boundaries. The length of Σ3 grain boundaries of the CSL boundaries is 50% or more of the length of Σ3-29 grain boundaries that is a total of respective lengths of Σ3 grain boundaries, Σ7 grain boundaries, Σ11 grain boundaries, Σ17 grain boundaries, Σ19 grain boundaries, Σ21 grain boundaries, Σ23 grain boundaries, and Σ29 grain boundaries included in the CSL boundaries and is 1% or more and 30% or less of the total length of all boundaries that is the sum of the length of Σ3-29 grain boundaries and the length of general boundaries. The crystal grain has a layered structure in which a first layer composed of nitride or carbonitride of $Al_xTi_{1-x}$ and a second layer composed of nitride or carbonitride of $Al_yT_{1-y}$ (where x≠y) are alternately stacked. The total thickness of the first layer and the second layer adjacent to each other is 3 nm or more and 30 nm or less.

The surface-coated cutting tool as described above has high hardness and excellent toughness. Therefore, the surface-coated cutting tool as described above can exhibit high wear resistance based on high hardness and high chipping-resistance performance based on excellent toughness to achieve a long life.

[2] In the surface-coated cutting tool as described above, a proportion B of the crystal grains having the angle of intersection of 10 degrees or more to less than 20 degrees in the hard layer is 30% or more. This further improves the toughness of the surface-coated cutting tool.

[3] In the surface-coated cutting tool as described above, the hard layer has a thickness of 1 μm or more and 15 μm or less. This can further improve the chipping resistance while keeping wear resistance of the surface-coated cutting tool.

[4] In the surface-coated cutting tool as described above, the hard layer has an indentation hardness by nanoindentation of 28 GPa or more and 38 GPa or less. This further improves the wear resistance of the surface-coated cutting tool.

[5] In the surface-coated cutting tool as described above, the hard layer has an absolute value of compression residual stress of 0.5 GPa or more and 5.0 GPa or less. This further improves the toughness of the surface-coated cutting tool.

[6] According to an aspect of the present invention, a method of producing the surface-coated cutting tool as described above includes: a first step of preparing the base material; and a second step of forming the hard layer by CVD. The second step includes a step of modulating a flow rate of both or one of $AlCl_3$ gas and $TiCl_4$ gas.

The method as described above can produce a surface-coated cutting tool that can exhibit high wear resistance based on high hardness and high chipping-resistance performance based on excellent toughness to achieve a long life.

[Details of Embodiments of the Present Invention]

Embodiments will be described below. In the drawings for use in the description of embodiments below, the same reference signs denote the same parts or corresponding parts.

As used in the present description, the expression in the form of "A to B" means the upper limit and the lower limit of a range (in other words, A or more and B or less), and in a case where the unit is not described for A and the unit is described for B alone, the unit for A and the unit for B are the same. When a chemical compound is expressed by a chemical formula in the present description, all atomic ratios conventionally known are included unless a particular atomic ratio is specified, and embodiments are not necessarily limited to those in a stoichiometric range. For example, in a description of "TiAlN", the ratio of atomicity in TiAlN is not limited to Ti:Al:N=0.5:0.5:1, and all atomic ratios conventionally known are included.

<<Surface-coated Cutting Tool>>

A surface-coated cutting tool according to the present embodiment includes a base material and a coating formed on the base material. Preferably, the coating covers the entire surface of the base material. However, the base material partially not coated with this coating or the coating having a partially different constitution does not depart from the scope of the present invention.

FIG. 1 is a photograph of a microscopic image of a cross section of a coating in a surface-coated cutting tool. In FIG. 1, a coating 20 is provided on a base material 10, and coating 20 is formed with a hard layer.

The surface-coated cutting tool according to the present embodiment has high hardness and excellent toughness. Therefore, high wear resistance based on high hardness and high chipping resistance based on excellent toughness can be fulfilled, and thereby a long life can be achieved. The surface-coated cutting tool according to the present embodiment therefore can be used suitably as a cutting tool such as a drill, an end mill, a cutting edge-replaceable cutting tip for drills, a cutting edge-replaceable cutting tip for end mills, a cutting edge-replaceable cutting tip for milling, a cutting edge-replaceable cutting tip for turning, a metal saw, a gear cutting tool, a reamer, and a tap.

<<Base Material>>

Any base material that is conventionally known as the base material of this kind can be used. For example, any one of cemented carbides (for example, including WC-based cemented carbides and those containing WC and Co or additionally including carbonitrides of Ti, Ta, Nb, and the like), cermets (mainly composed of TiC, TiN, TiCN, and the like), high-speed steel, ceramics (titanium carbide, silicon carbide, silicon nitride, aluminum nitride, aluminum oxide, and the like), sintered cubic crystal boron nitride, and sintered diamond is preferred.

Among those base materials, cemented carbide, in particular, WC-based cemented carbide, or cermet (in particular, TiCN-based cermet) is preferably selected. Theses base materials are particularly well balanced in hardness and strength at high temperatures and have excellent characteristics as base materials of surface-coated cutting tools for the above-noted applications.

When the surface-coated cutting tool is, for example, a cutting edge-replaceable cutting tip, the base material may include the one having a chip breaker or the one not having a chip breaker. The shape of the cutting edge ridge is any one of sharp edge (ridge where the cutting face and the flank intersect), honing (sharp edge with a curve), negative land (with a bevel), and a combination of honing and negative land.

<<Coating>>

In the present embodiment, the coating includes a hard layer. One or two or more hard layers can be included in the coating. It is needless to say that a layer other than the hard layer may be included.

The thickness of the coating is preferably 1 to 15 μm. The thickness of the coating in this range can suitably achieve the characteristics of the coating, including the effect of improving chipping resistance while keeping the wear resistance of the hard layer. If the thickness of the coating is less than 1 μm, toughness tends to be reduced. If the thickness exceeds 15 μm, the coating easily separates from the base material during cutting work. The total thickness of the coating is preferably 3 to 7.5 μm in terms of improving its characteristics.

The thickness of the coating can be measured by obtaining a cross-section sample parallel to the normal direction of the surface of the base material and observing this sample with a scanning transmission electron microscope (STEM). Examples of such a measurement method using an STEM include high-angle annular dark-field scanning transmission electron microscopy (HAADF-STEM).

As used in the present description "thickness" means the average thickness. Specifically, with the observation magnification of 5000 to 10000 times and with the observation area of about 100 to 500 μm$^2$ for the cross-section sample, the thickness widths at 10 places in a field of view are measured and their average is considered as "thickness". This is applicable to the thickness of each layer described later, unless otherwise specified.

<Hard Layer>

(Crystal Structure of Crystal Grains)

The hard layer includes a plurality of crystal grains having the sodium chloride-type crystal structure. The sodium chloride-type crystal structure of the crystal grains included in the hard layer can be observed, for example, using an X-ray diffractometer, an SEM-EBSD system, or a TEM analysis system.

In the hard layer, it is preferable that, of a plurality of crystal grains observed in the observation area (100 μm×100 μm) of the above-noted analysis system, 50% by area or more of crystal grains have the sodium chloride-type crystal structure. It is preferable that all of the crystal grains included in the hard layer are sodium chloride-type in terms of increasing the hardness of the hard layer.

(Orientation of Crystal Grains)

In the hard layer, when the crystal orientation of each of a plurality of crystal grains is analyzed using an electron back scatter diffraction (EBSD) system for the surface of the hard layer that is parallel to the normal direction of the surface of the base material to measure the angle of intersection between the normal direction to (001) plane that is a crystal plane of the crystal grain and the normal direction to the surface of the base material, the proportion A of the crystal grains having the angle of intersection of 0 degree or more to less than 20 degrees is 50% or more. When the hard layer satisfies this condition, the hard layer is particularly superior in toughness, contributing to excellent chipping resistance of the surface-coated cutting tool. The upper limit value of the proportion above is not limited but preferably 100% in terms of improving toughness.

The proportion A can be obtained specifically as follows. First of all, the hard layer is formed on the base material based on the production process described later. This hard layer is cut so as to obtain a cross section parallel to the normal direction of the surface of the base material. Thereafter, the cut surface is polished with waterproof abrasive paper (the one including SiC grain abrasive as an abrasive) and, if necessary, smoothed by ion milling using Ar ions.

The cutting is performed as follows. For example, the surface of the hard layer (or the coating surface in a case where another layer is formed on the hard layer) is tightly fixed using wax on a flat plate large enough to hold, and thereafter cut in a direction vertical to the flat plate with a cutter having a rotary blade (cut such that the rotary blade is set as vertical as possible to the flat plate). This is because the surface of the base material and the surface of the hard layer (coating surface) are thought to be parallel. This cutting can be performed at any part in the hard layer as long as it is performed in a vertical direction in this way. The polishing is performed using the above-noted waterproof abrasive paper #400, #800, #1500 in this order (the numbers (#) of the waterproof abrasive paper mean different grain diameters of the abrasive, and the greater the number, the smaller the grain diameter of the abrasive).

The cross-sectional polished surface of the hard layer thus can be prepared. This cross-sectional polished surface serves as an observation target surface and is observed using a field-emission scanning electron microscope (FE-SEM) equipped with an EBSD system. This observation can be performed by arranging focused electron beams individually on pixels and acquiring EBSD data in order. The observation position is preferably, though not limited thereto, the vicinity of the cutting edge ridge, considering the relation with the cutting characteristic.

The EB SD system can determine the crystal orientation in which a crystal grain is oriented and the degree of angle (angle of intersection) by which this crystal orientation intersects with the normal direction of the measurement target surface (that is, the normal direction of the surface of the base material), based on automatic analysis of the Kikuchi diffraction pattern produced by back diffraction electrons. Using this, the measurement target surface is captured using the system above, and the angle of intersection between the normal direction to (001) plane in each pixel of the captured image and the normal direction to the surface of the base material is measured.

In the measurement described above, the normal of the measurement target surface is inclined by 70° relative to the incident beam and the analysis is conducted at 15 kV. In order to avoid charging effects, a pressure of 10 Pa is applied. High current mode is used with an aperture diameter of 60 μm or 120 μm. Data is acquired for 500×300 pixels corresponding to the surface area of 50×30 μm of the measurement target surface and with steps of 0.1 μm/step. The pixels are then classified into the following angle of intersection ranges to form Groups 1 to 18.

Group 1: angles of intersection of 0 degree or more to less than 5 degrees

Group 2: angles of intersection of 5 degrees or more to less than 10 degrees

Group 3: angles of intersection of 10 degrees or more to less than 15 degrees

Group 4: angles of intersection of 15 degrees or more to less than 20 degrees

Group 5: angles of intersection of 20 degrees or more to less than 25 degrees

Group 6: angles of intersection of 25 degrees or more to less than 30 degrees

Group 7: angles of intersection of 30 degrees or more to less than 35 degrees

Group 8: angles of intersection of 35 degrees or more to less than 40 degrees

Group 9: angles of intersection of 40 degrees or more to less than 45 degrees

Group 10: angles of intersection of 45 degrees or more to less than 50 degrees

Group 11: angles of intersection of 50 degrees or more to less than 55 degrees

Group 12: angles of intersection of 55 degrees or more to less than 60 degrees

Group 13: angles of intersection of 60 degrees or more to less than 65 degrees

Group 14: angles of intersection of 65 degrees or more to less than 70 degrees

Group 15: angles of intersection of 70 degrees or more to less than 75 degrees

Group 16: angles of intersection of 75 degrees or more to less than 80 degrees

Group 17: angles of intersection of 80 degrees or more to less than 85 degrees

Group 18: angles of intersection of 85 degrees or more to less than 90 degrees.

Next, the angle of intersection frequency distribution is calculated by calculating the frequency that is the sum of pixel counts in each of Groups 1 to 18. That is, "frequency" corresponds to the sum of areas of crystal grains in each group when all of the crystal grains appearing in the measurement target surface are classified into Groups 1 to 18 according to the angle of intersection. The grouping and the calculation of the angle of intersection frequency distribution can be performed using, for example, commercially available software ("Orientation Imaging Microscopy Ver 6.2" manufactured by EDAX Inc.).

In the observation above, the vicinity of the base material-side interface and the vicinity of the front surface-side interface of the hard layer are excluded from the measurement target surface. In the hard layer, the vicinity of the base material-side interface is a section that is formed at the beginning of growth of the hard layer and has great variation of crystal grains, and is inappropriate as the position to specify the feature of the hard layer. In the hard layer, the vicinity of the front surface-side interface of the coating is also inappropriate as the position to specify the feature of the hard layer, because when another adjacent hard layer is present, the crystal grains vary widely if affected by measurement errors resulting from the physical characteristics of the hard layer. Therefore, the measurement target surface is set at a position 0.5 μm or more away from the base material-side interface and 0.1 μm or more away from the front surface-side interface. In view of ensuring the accuracy of the angle of intersection frequency distribution, it is preferable to appropriately select the observation magnification of the FE-SEM from the range of 2000 to 20000 times and appropriately select the observation area from the range of 50 to 1000 μm$^2$ so that 10 to 100 crystal grains appear in a field of view.

In the angle of intersection frequency distribution of the crystal grains as calculated according to the method above, the proportion A is 50% or more when the total frequency of Groups 1 to 4 is 50% or more of the total frequency of all groups. Such a hard layer has a high Young's modulus and therefore can improve toughness of the coating. The proportion A is preferably 55% or more, more preferably 60% or more.

In particular, in the present embodiment, the proportion B of the crystal grains in which the normal direction to (001) plane is 10 degrees or more to less than 20 degrees relative to the normal direction of the surface of the base material is preferably 30% or more. In other words, in the angle of intersection frequency distribution of the crystal grains, the total frequency of Group 3 and Group 4 is preferably 30% or more of the total frequency of all groups. This can dramatically improve the toughness. The proportion B is preferably 35% or more, more preferably 40% or more. The upper limit value of this proportion B is 100%.

It is noteworthy that when the angle of intersection range is set every 10 degrees in the angle of intersection frequency distribution of the crystal grains, the proportion B of crystal grains having the angle of intersection of 10 degrees or more to less than 20 degrees is preferably greater than other proportions. Specifically, it is preferable that the total frequency of Group 3 and Group 4 (corresponding to the proportion B) is greater than the total frequency of Group 1 and Group 2, the total frequency of Group 5 and Group 6, the total frequency of Group 7 and Group 8, the total frequency of Group 9 and Group 10, the total frequency of Group 11 and Group 12, the total frequency of Group 13 and Group 14, the total frequency of Group 15 and Group 16, and the total frequency of Group 17 and Group 18. The inventors of the present invention have found that chipping resistance is particularly excellent in this case. The reason for this, though not clear, may be that the shifting of the normal direction to (001) plane of the crystal grain by about 10 degrees from the normal direction to the surface of the base material can alleviate shocks applied on the hard coating in a micro level at the start of cutting with the highest load.

Figure 2:
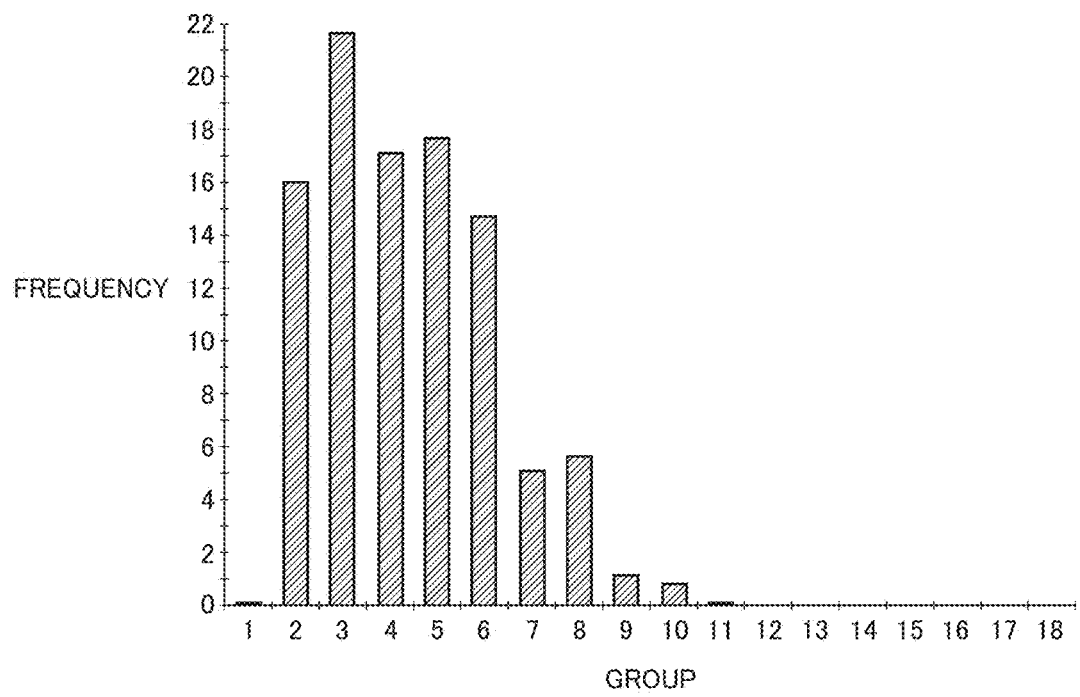
FIG. 2 is a graph showing an example of the angle of intersection frequency distribution of crystal grains included in a hard layer analyzed using an electron backscatter diffraction system.

An example of the graph illustrating the angle of intersection frequency distribution is shown in FIG. 2. The horizontal axis of this graph represents 18 groups into which crystal grains are classified, and the vertical axis represents frequency. In the example shown in FIG. 2, the proportion A is 55% of the total frequency of all groups and the proportion B is 39% of the total frequency of all groups.

(Boundary of Crystal Grains)

Between a plurality of crystal grains included in the hard layer, a "grain boundary" exists, which is the boundary between crystal grains. In particular, the grain boundaries between crystal grains included in the hard layer include CSL boundaries (coincidence site lattice boundaries) and general boundaries. The length of Σ3 grain boundaries of the CSL boundaries is 50% or more of the length of Σ3-29 grain boundaries that is the sum of the respective lengths of Σ3 grain boundaries, Σ7 grain boundaries, Σ11 grain boundaries, Σ17 grain boundaries, Σ19 grain boundaries, Σ21 grain boundaries, Σ23 grain boundaries, and Σ29 grain boundaries included in the CSL boundaries, and 1% or more and 30% or less of the total length of all boundaries that is the sum of the length of Σ3-29 grain boundaries and the length of general boundaries.

As used herein, the CSL boundary is characterized by the multiplicity index Σ and is defined as the ratio between the crystal lattice site density of two crystal grains adjoining the grain boundary and the density of the corresponding site when the two crystal lattices are superimposed. In the case of a simple structure, it is generally known that low-Σ grain boundaries tend to have low interface energy and special characteristics. Therefore, the control of the proportion of special grain boundaries and distribution of crystal grain orientation differences estimated from the CSL model is important for the characteristics of ceramic coatings and a method of improving those characteristics.

In the present description, the CSL boundaries include a Σ3 grain boundary, a Σ7 grain boundary, a Σ11 grain boundary, a Σ17 grain boundary, a Σ19 grain boundary, a Σ21 grain boundary, a Σ23 grain boundary, and a Σ29 grain boundary. However, even when one or more grain boundaries except a Σ3 boundary are not observed with the above-noted EBSD, it does not depart from the scope of the present embodiment as long as the effects of the present embodiment are exhibited. General boundaries are grain boundaries other than CSL grain boundaries. Therefore, general boundaries are the remainder excluding CSL boundaries from all boundaries of crystal grains when a cross section of the hard layer is observed with the EBSD.

The length of Σ3 grain boundaries refers to the total length of Σ3 grain boundaries in a field of view observed with the EBSD, as in the method of calculating the above-noted proportion A, and the length of Σ3-29 grain boundaries refers to the sum of the respective total lengths of Σ3 grain boundaries, Σ7 grain boundaries, Σ11 grain boundaries, Σ17 grain boundaries, Σ19 grain boundaries, Σ21 grain boundaries, Σ23 grain boundaries, and Σ29 grain boundaries in a field of view observed with the EBSD.

A Σ3 grain boundary is thought to have the lowest boundary energy of CSL grain boundaries, and, therefore, increasing the proportion in the Σ3-29 grain boundaries can be thought to enhance the mechanical characteristics (especially plastic deformation resistance). On the other hand, since the Σ3 grain boundary is a grain boundary having high coincidence, two crystal grains having a Σ3 grain boundary as a boundary exhibit behavior similar to single crystal or twin crystal, and the crystal grains tend to be coarse. If the crystal grains become coarse, the coating characteristics such as chipping resistance are reduced. Then, in the present embodiment, in order to prevent the crystal grains from becoming coarse, the length of Σ3 grain boundaries is defined as 50% or more of the length of Σ3-29 grain boundaries and defined as 1% or more and 30% or less of the total length of all boundaries that is the sum of the length of Σ3-29 grain boundaries and the length of general boundaries, thereby ensuring chipping resistance of the hard layer. Preferably, the length of Σ3 grain boundaries is less than 90% of the length of Σ3-29 grain boundaries and is 1% or more and 15% or less of the total length of all boundaries that is the sum of the length of Σ3-29 grain boundaries and the length of general boundaries. This is because if so, a hard coating having uniform grains and less variation in characteristics can be obtained.

In the present embodiment, whether the length of Σ3 grain boundaries is 50% or more of the length of Σ3-29 grain boundaries can be determined as follows. First, a measurement sample having a measurement target surface is fabricated in the same manner as in the method detailed in the section (Orientation of crystal grains). The measurement target surface is then observed using an FE-SEM equipped with an EBSD system. The vicinity of the two interfaces of the hard layer is excluded from the measurement target surface in the same manner as described above.

The normal of the measurement target surface is inclined by 70° relative to incident beams and the analysis is conducted at 15 kV. In order to avoid charging effect, a pressure of 10 Pa is applied. High current mode is used with an aperture diameter of 60 µm or 120 µm. Data is acquired at 500×300 points corresponding to a surface area of 50×30 µm on the polished surface with steps of 0.1 µm step.

Data processing is performed with and without noise filtering. Noise filtering and grain boundary character distribution are determined using commercially available software ("orientation Imaging microscopy Ver 6.2" manufactured by EDAX Inc.). The grain boundary character distribution is analyzed based on data available from Grimmer (H. Grimmer, R. Bonnet, Philosophical Magazine A 61(1990), 493-509), and using the Brandon criterion ($\Delta\Theta < \Theta_0(\Sigma)^{-0.5}$, here $\Theta_0=15°$, permissible errors from theoretical values of experimental values are taken into consideration (D. Brandon Acta meta 11.14 (1966), 1479-1484). Furthermore, the analysis of grain boundary character distribution can be confirmed by counting special grain boundaries corresponding to any given Σ value and expressing the count as the ratio to all boundaries. The length of Σ3 grain boundaries, the length of Σ3-29 grain boundaries, and the total length of all boundaries thus can be obtained.

(Layered Structure of Crystal Grain)

The crystal grain included in the hard layer has a layered structure in which a first layer composed of nitride or carbonitride of $Al_xTi_{1-x}$ and a second layer composed of nitride or carbonitride of $Al_yT_{1-y}$ (where x≠y) are alternately stacked into one or more layers. The compositions of the first layer and the second layer may be either nitride or carbonitride. It is noted that when the composition of the first layer is nitride, the composition of the second layer is also nitride. When the composition of the first layer is carbonitride, the composition of the second layer is also carbonitride.

More specifically, the crystal grains included in the hard layer each are a single crystal or a twin crystal of nitride or carbonitride of AlTi, and the atomic ratio of Al varies in the inside of this single crystal or twin crystal. This variation is periodic and continuous or stepwise. This causes minute distortion at a predetermined interface of the crystal grains included in the hard layer to form a layered structure including the first layer and the second layer distinguishable as different layers based on this distortion. This distortion then improves the hardness of the crystal grains.

Figure 3:
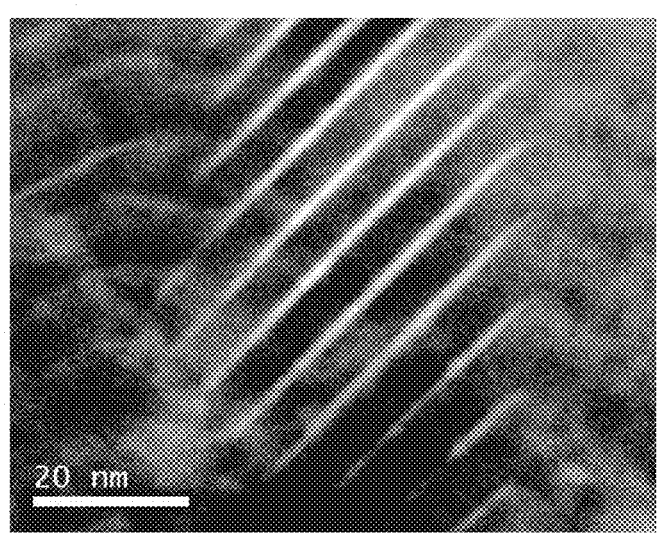
FIG. 3 is a photograph showing an enlarged view of the dashed box in FIG. 1.

FIG. 3 is a photograph showing an enlarged view of the dashed box in FIG. 1. In FIG. 3, the white (light) region is a region with a high atomic ratio of Ti compared with the black (dark) region. That is, it can be understood from FIG. 3 that the Ti-rich white region and the Al-rich black region are alternately present in the hard layer.

When the crystal grain has the crystal structure of a twin crystal, it is more preferable that the Σ3 grain boundary exists as the line symmetry axis in this crystal structure of a twin crystal and that the above-noted layered structure is present on both sides of this axis. In this case, the layered structure can be grown stably for a long time.

It is further preferable that the atomic ratio x of Al in the first layer varies in a range of 0.76 or more to less than 1 in each first layer and that the atomic ratio y of Al in the second layer varies in a range of 0.45 or more to less than 0.76 in each second layer. That is, it is preferable that the crystal grain included in the hard layer has a layered structure in which the first layer having the atomic ratio of Al varying with a high ratio being kept and the second layer having the atomic ratio of Al varying with a relatively low ratio being kept compared with the first layer are arranged alternately.

The atomic ratio x of Al in the first layer is not to be less than 0.76. This is because the atomic ratio x of less than 0.76 should be rather called the atomic ratio y of Al in the second layer. Based on the same reason, the atomic ratio y is not to be 0.76 or more. The atomic ratio x is not 1 because the first layer includes Ti. On the other hand, in terms of improving toughness while keeping high wear resistance, the atomic ratio y is 0.45 or more. If the atomic ratio y is less than 0.45, the decrease in Al amount causes degradation in oxidation resistance, which increases the possibility that toughness is reduced due to oxidation of the coating.

The atomic ratio x and the atomic ratio y are obtained as follows. A cross-section sample parallel to the normal direction of the surface of the base material in the hard layer is obtained, and the crystal grain appearing in this cross-section sample is analyzed using an energy dispersive X-ray spectroscopy (EDX) system installed in an SEM or a TEM to calculate the atomic ratio at the analyzed position. The analysis using EDX is repeated to expand the target for calculating the atomic ratio x and the atomic ratio y over the entire surface of the cross-section sample. Thus, the atomic ratio x and the atomic ratio y at a certain position in the hard layer can be specified.

Furthermore, it is preferable that the largest value of the difference between the atomic ratio x and the atomic ratio y is 0.05 or more and 0.5 or less. The more preferable largest value of the difference between the atomic ratio x and the atomic ratio y is 0.26 or more and 0.45 or less. If the largest value of the difference between the atomic ratio x and the atomic ratio y is less than 0.05, the distortion in the crystal grain is reduced, and thus the hardness of the crystal grain tends to be reduced. On the other hand, if the largest value of the difference exceeds 0.5, the distortion in the crystal grain is too large and the lattice defect increases, so that the hardness of the crystal grain tends to be reduced.

The largest value of the difference between the atomic ratio x and the atomic ratio y refers to a value obtained by calculating the values of the atomic ratio x and the atomic ratio y based on a cross-section sample by the method described above, and then obtaining the difference between the largest value of all of the calculated values of the atomic ratio x and the smallest value of all of the calculated values of the atomic ratio y. That is, it is equivalent to the value obtained when the difference between the largest value of the atomic ratio x and the smallest value of the atomic ratio y selected from the values in the entire hard layer is obtained.

(Total Thickness of Adjacent First Layer and Second Layer)

In the present embodiment, the total thickness of adjacent first layer and second layer (which hereinafter may be referred to as "stacking cycle") is 3 to 30 nm. The layered structure including the first layer and the second layer with such a thickness makes the crystal grain hard and improves toughness. When this thickness exceeds 30 nm, the crystal grain changes to the wurtzite crystal structure, so that the hardness tends to be reduced to adversely affect the wear resistance. The total thickness of the adjacent first layer and second layer is preferably 5 to 25 nm.

At least one set of adjacent first layer and second layer may have a thickness of 3 to 30 nm. However, it is preferable that all sets of adjacent first layer and second layer have a thickness of 3 to 30 nm because if so, a coating with excellent chipping resistance can be produced stably.

The total thickness of adjacent first layer and second layer is obtained, for example, by obtaining a cross-section sample at any given location (preferably, the vicinity of the cutting edge ridge), measuring the total thickness of 10 sets of adjacent first layer and second layer in 10 crystal grains appearing in the cross section, and expressing the average value as the total thickness. In doing so, with the observation magnification of 500000 times and with the observation area of about 0.1 $\mu m^2$, adjustment is made such that one crystal grain appears in a field of view. This is repeatedly performed 10 times or more to measure a sufficient number of "the total thickness of adjacent first layer and second layer" to calculate the average value.

(Aspect Ratio of Crystal Grain)

In the present embodiment, the average aspect ratio A of the crystal grain included in the hard layer is preferably 2 or more. In the present embodiment, in each individual crystal grain, the largest width in the direction vertical to the crystal growth direction is defined as a grain width w, the largest length in the direction vertical to this grain width w is defined as a grain length 1, and the ratio between w and 1(l/w) is defined as the aspect ratio $\alpha$ of each individual crystal grain. The average value of aspect ratios $\alpha$ obtained for individual crystal grains is defined as an average aspect ratio A, and the average value of grain widths w obtained for individual crystal grains is defined as an average grain width W. Here, it is more preferable that the crystal grain included in the hard layer has an average aspect ratio A of 2 or more and an average grain width W of 0.5 $\mu m$ or less.

The crystal grain that satisfies the conditions above has a columnar structure and thus can exhibit excellent chipping resistance and wear resistance. If the average aspect ratio A of the crystal grain exceeds 100, a crack easily propagates through the interface between the first layer and the second layer and the grain boundary between crystal grains. The average aspect ratio A of the crystal grain is preferably 30 to 80, more preferably 40 to 60. The average grain width W of the crystal grain of less than 0.1 $\mu m$ is not preferable because if so, toughness is reduced. If the average grain width W of the crystal grain exceeds 1.0 $\mu m$, the wear resistance is reduced. Therefore, the average grain width W of the crystal grain included in the hard layer is preferably 0.1 to 1.0 $\mu m$. More preferably, the average grain width W of the crystal grain is 0.2 to 0.8 $\mu m$.

The average aspect ratio A can be measured, for example, by observing the measurement target surface with an STEM, in the same manner as when the thicknesses of the first layer and the second layer in the crystal grain are measured. For example, 10 crystal grains appearing in a microscopic image of the STEM are selected, and the grain width w and the grain length 1 are specified for each of these crystal grains. Next, the ratio (l/w) is calculated as the aspect ratio $\alpha$ of each individual crystal grain, and the average value of aspect ratio $\alpha$ is calculated. The vicinity of the two interfaces in the hard layer are excluded from the measurement target surface in the same manner as described above.

(Indentation Hardness)

In the hard layer, it is preferable that the indentation hardness by nanoindentation is 28 to 38 GPa. More preferably, the indentation hardness is 30 to 36 GPa. When the indentation hardness by nanoindentation of the hard layer falls in the above-noted range, the wear resistance of the surface-coated cutting tool according to the present embodiment is improved. In particular, excellent performance is achieved when cutting work for materials difficult to cut, such as heat-resistant alloys is performed.

The indentation hardness can be measured using a microminute indentation hardness tester that allows for nanoindentation. Specifically, an indenter is pushed at a predetermined load (for example 30 mN) vertically in the thickness direction of the hard layer, and the indentation hardness is calculated based on the depth that the indenter is pushed into. When another layer such as a surface coating layer is present on the hard layer, the surface coating layer is removed by Calotest or bevel lapping to expose the hard layer, and the above-noted method is used for the exposed hard layer to measure indentation hardness.

(Compression Residual Stress)

The hard layer preferably has compression residual stress. The residual stress is preferably 0.5 GPa or more and 5 GPa or less. That is, when the hard layer has compression residual stress, the absolute value thereof is preferably 5 GPa or less. When the absolute value of compression residual stress of the hard layer falls in the above-noted range, the toughness of the hard layer can be dramatically improved. When the absolute value of compression residual stress exceeds 5 GPa, chipping tends to occur. When the hard layer has compression residual stress, the absolute value thereof is preferably 0.5 GPa or more. If the absolute value of compression residual stress falls below 0.5 GPa, toughness tends to be reduced. The compression residual stress of the hard layer can be controlled by adjusting the stacking cycle of the first layer and the second layer in the crystal grain included in the hard layer.

As used herein "compression residual stress" is a kind of internal stress (inherent strain) existing in the layer. The compression residual stress refers to stress expressed in "−" (minus) numerical values (expressed in the unit "GPa" in the present description). Therefore, the concept that compression residual stress is large indicates that the absolute value of the above-noted numerical value is large, whereas the concept that compression residual stress is small indicates that the absolute value of the numerical value is small.

The compression residual stress of the hard layer can be measured, for example, by the $\sin^2\psi$ method using an X-ray stress analyzer. This $\sin^2\psi$ method using X rays is widely used as a method of measuring compression residual stress of polycrystalline materials. For example, the method described in details in pp. 54 to 67 of "X-sen oryoku sokuteihou" (the Society of Materials Science, Japan, 1981, published by Yokendo Co., Ltd.) can be used. In the case where the $\sin^e w$ method is applied to measure the compression residual stress of the hard layer, when another layer such as a surface coating layer is present on the hard layer, the surface coating layer is removed as necessary by electropolishing, flat milling, or other process to expose the hard layer, and the compression residual stress is measured for the exposed hard layer.

(Thickness of Hard Layer)

The hard layer preferably has a thickness of 1 to 15 μm. When the thickness of the hard layer falls in the range above, the effect of improving chipping resistance while keeping wear resistance can be noticeable. If the thickness of the hard layer is less than 1 μm, toughness is not sufficient. If the thickness exceeds 15 μm, chipping tends to occur. The thickness of the hard layer is further preferably 3 to 7.5 μm in terms of improving its characteristics.

(Impurities)

The hard layer may contain chlorine (Cl), oxygen (O), boron (B), cobalt (Co), tungsten (W), chromium (Cr), tantalum (Ta), niobium (Nb), carbon (C), and the like as long as there is no effect on the operation effects of the present embodiment. That is, the hard layer is permitted to be formed to contain impurities such as inevitable impurities.

<Other Layers>

In the present embodiment, the coating may include a layer other than the hard layer. For example, an underlying layer capable of enhancing the bonding strength between the base material and the coating may be included. Examples of such a layer include a TiN layer, a TiCN layer, and a composite layer of a TiN layer and a TiCN layer. The underlying layer can be produced by conventionally known production processes.

Examples of other underlying layers may include a compound layer composed of at least one element selected from the group consisting of Ti, Zr, and Hf and at least one element selected from the group consisting of N, O, C, and B. This compound layer also can enhance the bonding strength between the base material and the coating. At least one of an α-$Al_2O_3$ layer and a κ-$Al_2O_3$ layer may be included as a surface coating layer positioned on the outermost surface of the coating. The α-$Al_2O_3$ layer and the κ-$Al_2O_3$ layer can improve oxidation resistance of the coating.

<Operation Effects>

Even when the surface-coated cutting tool according to the present embodiment is used for, for example, high-speed interrupted cutting of stainless steel, occurrence of chipping, loss, and separation can be suppressed. Because of high hardness, wear resistance is also fulfilled. Accordingly, the surface-coated cutting tool according to the present embodiment can exhibit high wear resistance based on high hardness and high chipping-resistance performance based on excellent toughness to achieve a long life.

<<Method of Producing Surface-Coated Cutting Tool>>

The method of producing a surface-coated cutting tool according to the present embodiment includes a first step of preparing a base material and a second step of forming a hard layer by CVD. In particular, the second step includes a step of modulating the flow rate of both or one of $AlCl_3$ gas and $TiCl_4$ gas. This can produce a surface-coated cutting tool having the configuration and effects as described above.

Figure 4:
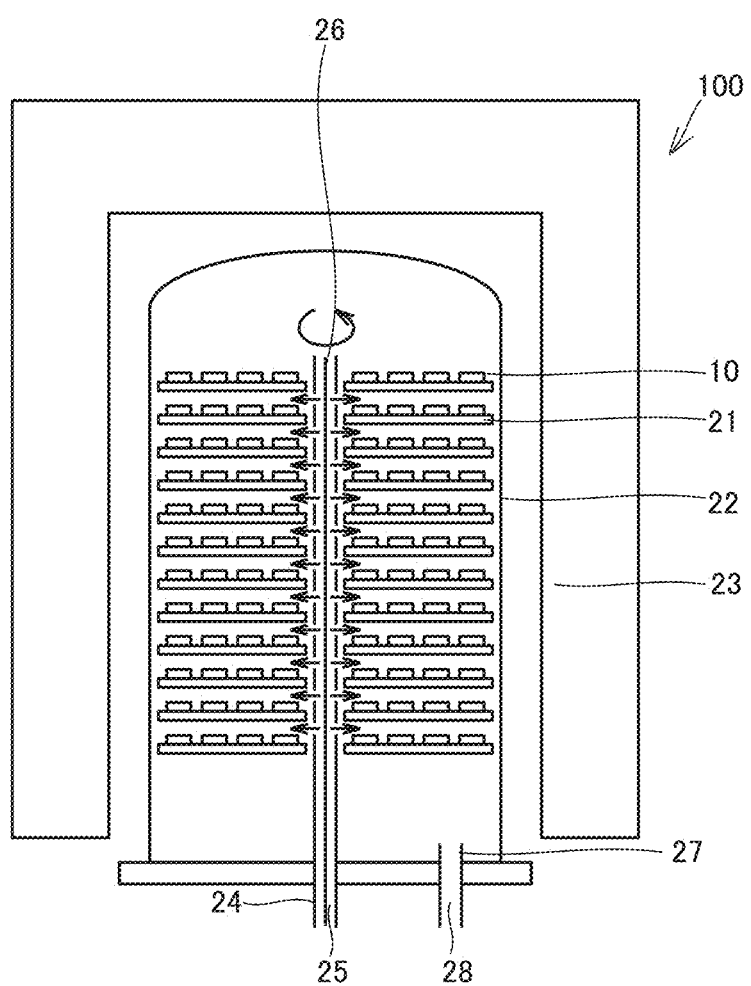
FIG. 4 is a diagram schematically showing a chemical vapor deposition (CVD) system for use in a method of producing a surface-coated cutting tool according to the present embodiment.

An example of the CVD system used in the method of producing a surface-coated cutting tool according to the present embodiment will be described with reference to FIG. 4. As shown in FIG. 4, a CVD system 100 includes a plurality of base material-holding jigs 21 for holding base materials 10 and a reaction chamber 22 formed of heat-resistant alloy steel for surrounding base material-holding jigs 21. A temperature regulating device 23 for controlling the temperature in reaction chamber 22 is provided around reaction chamber 22.

In reaction chamber 22, a gas introducing pipe having a first gas introducing pipe 24 and a second gas introducing pipe 25 adjacent and joined to each other is provided to extend vertically in the interior space of reaction chamber 22 and to be rotatable about its axis 26. The gas introducing pipe is configured such that gas introduced to first gas introducing pipe 24 and gas introduced to second gas introducing pipe 25 are not mixed in the inside. Part of first gas introducing pipe 24 and part of second gas introducing pipe 25 have a plurality of through holes for ejecting the gases flowing in first gas introducing pipe 24 and second gas introducing pipe 25 onto base materials 10 installed on base material-holding jigs 21.

In reaction chamber 22, a gas exhaust pipe 27 is further provided for exhausting the gas in the inside of reaction chamber 22 to the outside. The gas in the inside of reaction chamber 22 passes through gas exhaust pipe 27 and is discharged through a gas exhaust port 28 to the outside of reaction chamber 22.

The method of producing a surface-coated cutting tool using CVD system 100 will now be described. In the following, for convenience of explanation, the hard layer of Al, Ti, and N is directly formed on the base material. However, in the second step, the hard layer may be formed after another layer such as an underlying layer is formed on the base material. Furthermore, after the hard layer is formed, a surface coating layer may be formed for improving oxidation resistance. The underlying layer and the surface coating layer can be formed by conventionally known processes.

<First Step>

In the first step, a base material is prepared. A commercially available base material may be used, or a base material may be produced by general powder metallurgy. For example, in a case where a cemented carbide base material is produced as the base material by general powder metallurgy, WC powder, Co powder, and the like are mixed with a ball mill to yield a powder mixture. The powder mixture is dried and thereafter formed into a predetermined shape to yield a compact. The compact is sintered to obtain WC-Co-based cemented carbide (sinter). The sinter is then subjected to predetermined edge sharpening such as honing to produce a base material of WC-Co-based cemented carbide. In the first step, any of those conventionally known as base materials of this type can be prepared, rather than the base material described above.

<Second Step>

In the second step, a hard layer is formed on the base material by CVD using CVD system 100.

Specifically, first of all, a tip of any given shape is attached as base material 10 to base material-holding jig 21 in reaction chamber 22 of CVD system 100. Then, the temperature of base material 10 installed in base material-holding jig 21 is increased to 700 to 750° C. using temperature regulating device 23. The internal pressure of reaction chamber 22 is set to 2.0 to 3.0 kPa.

Next, while first gas introducing pipe 24 and second gas introducing pipe 25 are rotated about axis 26, a first gas group including $TiCl_4$ gas and $AlCl_3$ gas is introduced to first gas introducing pipe 24 and a second gas group including $NH_3$ gas is introduced to second gas introducing pipe 25. Thus, the first gas group and the second gas group are ejected into reaction chamber 22 through the through holes of first gas introducing pipe 24 and the through holes of second gas introducing pipe 25.

The ejected first gas group and second gas group are uniformly mixed in reaction chamber 22 through rotation operation, and this gas mixture moves onto base material 10. The gas components included in the first gas group and the gas components included in the second gas group chemically react to form nuclei of crystal grains including Al, Ti, and N on base material 10. Subsequently, the first gas group is ejected through the through holes of the first gas introducing pipe 24, and the second gas group is ejected from the through holes of the second gas introducing pipe 25. Thus, the nuclei of crystal grains are grown to form a hard layer including crystal grains including Al, Ti, and N.

In particular, in the present embodiment, when the hard layer is formed, crystal grains are grown while the flow rate of both or one of $AlCl_3$ gas and $TiCl_4$ gas is modulated. This process includes a first crystal growth process of modulating the flow rate of $TiCl_4$ gas while keeping constant the flow rate (volume %) of $AlCl_3$ gas in the entire reaction gas, and a second crystal growth process of modulating the flow rate of $AlCl_3$ gas while keeping constant the flow rate of $TiCl_4$ gas in the entire reaction gas.

In the first crystal growth process, the atomic ratio of Ti can be controlled by adjusting the flow rate of $TiCl_4$ gas (that is, the atomic ratio of Al also can be controlled). Specifically, the first gas group is introduced to first gas introducing pipe 24 under the condition that while the flow rate of $AlCl_3$ gas is kept constant at 3 to 6 volume %, the flow rate of $TiCl_4$ gas is kept at 1 to 3 volume % (High Flow) for 3 to 15 seconds. Thereafter, the flow rate of $TiCl_4$ gas is immediately switched between High and Low, and the first gas group is introduced to first gas introducing pipe 24 under the condition that the flow rate of $TiCl_4$ gas is kept at 0.2 to 0.8 volume % (Low Flow) for 3 to 15 seconds. Thereafter, the flow rate of $TiCl_4$ gas is further switched between High and Low. This operation is repeated multiple times to form a hard layer including crystal grains having a layered structure in which the first layer and the second layer are alternately stacked.

In the second crystal growth process, the atomic ratio of Al can be controlled by adjusting the flow rate of $AlCl_3$ gas (that is, the atomic ratio of Ti also can be controlled). Specifically, the first gas group is introduced to first gas introducing pipe 24 under the condition that while the flow rate of $TiCl_4$ gas is kept constant at 0.5 to 1.5 volume %, the flow rate of $AlCl_3$ gas is kept at 6 to 10 volume % (High Flow) for 5 to 15 seconds. Thereafter, the flow rate of $AlCl_3$ gas is immediately switched between High and Low, and the first gas group is introduced to first gas introducing pipe 24 under the condition that the flow rate of $AlCl_3$ gas is kept at 1 to 4 volume % (Low Flow) for 5 to 15 seconds. Thereafter, the flow rate of $AlCl_3$ gas is further switched between High and Low. This operation is repeated multiple times to form a hard layer including crystal grains having a layered structure in which the first layer and the second layer are alternately stacked.

In the first crystal growth process and the second crystal growth process, the thicknesses of the first layer and the second layer, the total thickness of adjacent first layer and second layer, and the thickness of the hard layer can be controlled to the respective desired thicknesses by adjusting, for example, the time for ejecting $TiCl_4$ gas or $AlCl_3$ gas at High Flow, the time for ejecting $TiCl_4$ gas or $AlCl_3$ gas at Low Flow, and the number of times the flow rate of $TiCl_4$ gas or $AlCl_3$ gas is switched from High Flow to Low Flow or from Low Flow to High Flow.

In addition, the orientation of the crystal grains included in the hard layer can be controlled such that the above-noted proportion A is satisfied by setting the internal pressure of reaction chamber 22 and the temperature of base material 10 in the range above. Furthermore, the length of Σ3 grain boundaries can be set to 50% or more of the length of Σ3-29 grain boundaries and to 1% or more to 30% or less of the total length of all boundaries that is the sum of the length of Σ3-29 grain boundaries and the length of general boundaries by controlling volume % of $NH_3$ and $C_2H_4$ gas serving as source gas of the chemical reaction.

Here, the first gas group preferably includes hydrogen chloride (HCl) gas and hydrogen ($H_2$) gas serving as a carrier gas, in addition to $TiCl_4$ and $AlCl_3$ gas. The second gas group preferably includes argon gas in addition to $NH_3$ gas. Nitrogen ($N_2$) gas may be additionally included. However, in order to effectively grow crystal grains having a sodium chloride-type crystal structure as in the present embodiment, the second gas group preferably includes ammonia ($NH_3$) gas and argon gas without nitrogen ($N_2$) gas. Furthermore, when crystal grains including carbonitride of AlTi are to be grown, preferably, ethylene ($C_2H_4$) gas is additionally included in the first gas group.

The hard layer can be formed as described above, and thus the surface-coated cutting tool according to the present embodiment can be produced.

EXAMPLES

<<Measurement Method>>

A measurement target surface used in measurement was prepared by polishing a cross section parallel to the normal direction of the surface of the base material with waterproof abrasive paper as described above and then further smoothing the cross section by ion milling with Ar ions. The ion milling device and the conditions of the process are as follows:

ion milling device: "SM-09010" manufactured by JEOL Ltd.
acceleration voltage: 6 kV
radiation angle: 0° in the normal direction of the base material surface
radiation time: 6 hours.

The total thickness of the coating, the thickness of each layer such as the hard layer, the presence of the first layer and the second layer in a crystal grain, and the average value (stacking cycle) of the total thickness of adjacent first layer and second layer were determined by observing the measurement target surface using high-angle annular dark-field scanning transmission electron microscopy using a STEM ("JEM-2100F" manufactured by JEOL Ltd.). The crystal structure of the crystal grains included in the hard layer was observed with an X-ray diffractometer ("SmartLab" manufacture by Rigaku Corporation).

The atomic ratio x of Al in the first layer and the atomic ratio y of Al in the second layer were calculated by an EDX system in TEM ("SD100GV" manufactured by JEOL Ltd.) and the largest value of x−y was obtained based on the calculated values of the atomic ratios x, y. In the measurement of the angle of intersection frequency distribution for calculating the proportion A and the proportion B, and the measurement of the length of Σ3 grain boundaries and the length of Σ3-29 grain boundaries, an FE-SEM equipped with an EBSD system ("Zeiss Supra 35 VP", manufactured by CARL ZEISS AG) was used.

The indentation hardness (GPa) by nanoindentation of the hard layer was measured using a super-micro indentation hardness tester ("ENT-1100a" manufactured by Elionix Inc.). The compression residual stress (GPa) of the hard layer was calculated by the $\sin^2 w$ method using an X-ray stress analyzer ("SmartLab" manufactured by Rigaku Corporation). The values reported in the known literature by N. Norrby et al. "Surface & Coatings Technology 257 (2014) 102-107" were used as the physical coefficients used in measuring stress. In doing so, stress is preferably measured, considering the kind of the base material used, by selecting a diffraction peak on the high angle side and with a minimum of overlapping of peaks of the first hard coating layer and the base material.

<<Preparation of Base Material>>

In the first step, a base material A and a base material B were prepared. Specifically, raw material powders of the formulated composition (% by mass) in Table 1 were uniformly mixed. Here, "remainder" in Table 1 indicates that WC makes up the rest of the formulated composition (% by mass). Then, this powder mixture was press-formed into a predetermined shape and then sintered at 1300 to 1500° C. for 1 to 2 hours to obtain base material A (shape: CNMG120408NUX) and base material B (shape: SEET13T3AGSN-G) composed of cemented carbide. Both shapes are products manufactured by SUMITOMO ELECTRIC HARDMETAL CORP. Base material A, CNMG120408NUX is in the shape of a cutting edge-replaceable cutting tip for turning, and the base material B, SEET13T3AGSN-G is in the shape of a cutting edge-replaceable cutting tip for milling.

TABLE 1

| Type | | Formulated composition (wt. %) | | | | | |
|---|---|---|---|---|---|---|---|
| | | Co | VC | $Cr_3C_2$ | NbC | TaC | WC |
| Base material | A | 5.0 | 0.2 | 0.3 | — | — | remainder |
| | B | 10.0 | — | — | 0.1 | 2.0 | remainder |

<<Formation of Coating>>

In the second step, an underlying layer (TiN, or TiN and TiCN in some samples) having a composition shown in Table 2 with a thickness as shown in Table 9 was formed on the surface of base material A and base material B. On the underlying layer, the hard layer described later with a thickness as shown in Table 9 was formed. In addition, as shown in Table 9, a surface coating layer ($Al_2O_3$) was also formed in some samples. The underlying layer is a layer in direct contact with the surface of the base material. The surface coating layer is a layer formed on the hard layer and forms a surface of the cutting tool.

TABLE 2

| | Deposition condition | | | |
|---|---|---|---|---|
| | | Reaction atmosphere | | |
| Coating type | Reaction gas composition (volume %) | Pressure (kPa) | Temperature (° C.) | Total gas flow rate (L/min) |
| TiN (underlying layer) | $TiCl_4$ = 2.0%, $N_2$ = 39.7%, $H_2$ = remainder | 6.7 | 915 | 44.7 |
| TiCN (underlying layer) | $TiCl_4$ = 2.0%, $CH_3CN$ = 0.7%, $H_2$ = remainder | 9 | 860 | 35.4 |
| $Al_2O_3$ (surface coating layer) | $AlCl_3$ = 1.6%, $CO_2$ = 4.5%, $H_2S$ = 0.2%, HCl = 3.5%, $H_2$ = remainder | 6.7 | 1000 | 32.3 |

Here, the field "deposition conditions" in Table 2 shows "reaction gas composition (volume %)" for forming the underlying layer and the surface coating layer, and the conditions including pressure (kPa), temperature (° C.), and total gas flow rate (L/min) in "reaction atmosphere". In the field "reaction gas composition (volume %)" in Table 2, $H_2$ gas="remainder" means that $H_2$ gas makes up the rest of the reaction gas composition (volume %).

For example, the "TiN (underlying layer)" field in Table 2 shows the conditions of forming a TiN layer as the underlying layer. According to Table 2, the TiN layer can be formed by arranging a base material in the reaction chamber of a known CVD system including CVD system 100 shown in FIG. 4 and ejecting a gas mixture including 2.0 volume % of $TiCl_4$ gas, 39.7 volume % of $N_2$ gas, and the remainder of $H_2$ gas into the reaction chamber in the atmosphere at a pressure of 6.7 kPa and a temperature of 915° C., with a total gas flow rate of 44.7 L/min. The thickness of each layer can be controlled by the time for ejecting reaction gas.

<Formation of Hard Layer>

The hard layer was formed using CVD system 100 as shown in FIG. 4 under any one of the formation conditions 1A to 1H, 2A to 2H, X, and Y shown in Table 3 to Table 5.

In brief, in the formation conditions 1A to 1H, the first crystal growth process was used in which crystal grains were grown by modulating the flow rate of $TiCl_4$ gas while keeping the flow rate of $AlCl_3$ gas constant. In the formation conditions 2A to 2H, the second crystal growth process was used in which crystal grains were grown by modulating the flow rate of $AlCl_3$ gas while keeping the flow rate of $TiCl_4$ gas constant. In the formation condition X, crystal grains were grown by intermittently supplying the first gas group and the second gas group while the flow rates of $AlCl_3$ gas and $TiCl_4$ gas were not modulated but kept constant. Specifically, the first gas group and the second gas group were supplied in a cycle of 0.8-second stop and 0.2-second ejection. In the formation condition Y, crystal grains were grown by ejecting gas continuously with constant flow rates of $AlCl_3$ gas and $TiCl_4$ gas.

pressure of the reaction chamber is set to 3.0 kPa, and the total gas flow rate, which is a total of the flow rates of the first gas group and the second gas group, is set to 60.5 L/min. Under this condition, the first gas group is introduced to first gas introducing pipe 24 under the condition that while the flow rate of $AlCl_3$ gas is kept constant at 5 volume %, 0.5 volume % (Low Flow) is kept for 3 seconds (Time) for $TiCl_4$ gas. Thereafter, the flow rate of $TiCl_4$ gas is immediately switched between High and Low, and the first gas group is introduced to first gas introducing pipe 24 under the condition that, with the flow rate of $AlCl_3$ gas kept at the concentration above, the flow rate of $TiCl_4$ gas is kept at 1.5

TABLE 3

| | | Furnace | | First gas group | | | | | | | | | Second gas group | |
| | | | | | $TiCl_4$ | | | | | | | | | |
| | Deposition | internal | Total gas | Low | | | High | | | | | | | |
| Formation condition | temperature ° C. | pressure kPa | flow rate L/min | Flow (vol. %) | Time (sec) | Interval (min$^{-1}$) | Flow (vol. %) | Time (sec) | Interval (min$^{-1}$) | $AlCl_3$ (vol. %) | $C_2H_4$ (vol. %) | $H_2$ (vol. %) | $NH_3$ (vol. %) | Ar (vol. %) |
|---|---|---|---|---|---|---|---|---|---|---|---|---|---|---|
| 1A | 750 | 3.0 | 60.5 | 0.5 | 3 | 10 | 1.5 | 3 | 10 | 5.0 | 0.0 | remainder | 7.5 | 20 |
| 1B | 750 | 3.0 | 60.5 | | 10 | 3 | | 10 | 3 | 5.0 | 1.0 | | 7.5 | 20 |
| 1C | 750 | 3.0 | 60.5 | | 15 | 2 | | 15 | 2 | 5.0 | 2.0 | | 7.5 | 20 |
| 1D | 730 | 2.5 | 70.2 | | 5 | 6 | | 5 | 6 | 5.5 | 0.5 | | 8.0 | 25 |
| 1E | 730 | 2.5 | 70.2 | | 10 | 3 | | 10 | 3 | 5.5 | 2.0 | | 8.0 | 25 |
| 1F | 720 | 2.8 | 55.8 | | 5 | 6 | | 5 | 6 | 4.0 | 0.0 | | 6.0 | 15 |
| 1G | 720 | 2.8 | 55.8 | | 10 | 3 | | 10 | 3 | 4.0 | 0.0 | | 6.0 | 15 |
| 1H | 700 | 3.0 | 50.4 | | 10 | 3 | | 10 | 3 | 3.5 | 1.0 | | 5.0 | 10 |

TABLE 4

| | | Furnace | | First gas group | | | | | | | | | Second gas group | |
| | | | | | $AlCl_3$ | | | | | | | | | |
| | Deposition | internal | Total gas | Low | | | High | | | | | | | |
| Formation condition | temperature ° C. | pressure kPa | flow rate L/min | Flow (vol. %) | Time (sec) | Interval (min$^{-1}$) | Flow (vol. %) | Time (sec) | Interval (min$^{-1}$) | $TiCl_4$ (vol. %) | $C_2H_4$ (vol. %) | $H_2$ (vol. %) | $NH_3$ (vol. %) | Ar (vol. %) |
|---|---|---|---|---|---|---|---|---|---|---|---|---|---|---|
| 2A | 750 | 3.0 | 60.5 | 1 | 10 | 3 | 9 | 15 | 2 | 1.0 | 0.8 | remainder | 7.5 | 30 |
| 2B | 750 | 3.0 | 60.5 | 2 | 10 | 3 | 8 | 10 | 3 | | 1.0 | | 7.5 | 30 |
| 2C | 750 | 3.0 | 60.5 | 3 | 10 | 3 | 7 | 15 | 2 | | 1.5 | | 7.5 | 30 |
| 2D | 750 | 3.0 | 60.5 | 3 | 10 | 3 | 10 | 10 | 3 | | 0.8 | | 8.0 | 30 |
| 2E | 720 | 2.8 | 55.8 | 1 | 5 | 6 | 10 | 5 | 6 | | 1.0 | | 10.0 | 35 |
| 2F | 700 | 3.0 | 50.4 | 1 | 15 | 2 | 8 | 15 | 2 | | 0.2 | | 9.0 | 40 |
| 2G | 720 | 2.8 | 55.8 | 4 | 10 | 3 | 7 | 10 | 3 | | 0.0 | | 6.0 | 35 |
| 2H | 730 | 2.5 | 70.2 | 4 | 10 | 3 | 6 | 10 | 3 | | 0.5 | | 5.0 | 25 |

TABLE 5

| | Deposition temperature ° C. | Furnace internal pressure kPa | Total gas flow rate L/min | First gas group | | | | | | Second gas group | | | | |
| | | | | $TiCl_4$ (vol. %) | $AlCl_3$ (vol. %) | $N_2$ (vol. %) | $H_2$ (vol. %) | Supply cycle (sec) | Supply time/ cycle (sec) | $NH_3$ (vol. %) | $N_2$ (vol. %) | $H_2$ (vol. %) | Supply cycle (sec) | Supply time/ cycle (sec) |
| Formation condition | | | | | | | | | | | | | | |
|---|---|---|---|---|---|---|---|---|---|---|---|---|---|---|
| X | 800 | 4.7 | 70.0 | 0.2 | 0.7 | 0 | remainder | 1 | 0.2 | 2.5 | 0 | 70 | 1 | 0.2 |
| Y | 800 | 3.0 | 60.0 | 0.15 | 0.9 | 0 | remainder | — | — | 3.3 | 40 | remainder | — | — |

For example, in Table 3 to Table 5, the formation condition "1A" indicates that the hard layer is formed under the condition as follows. That is, the deposition temperature (base material temperature) is set to 750° C., the internal volume % (High Flow) for 3 seconds (Time). Thereafter, the $TiCl_4$ gas flow rate is further switched between High and Low. Such operation is subsequently performed multiple times as desired.

Accordingly, in the formation condition "1A", TiCl$_4$ gas is introduced to first gas introducing pipe 24 at High Flow and Low Flow 10 times (Interval) each with a 3-second interval per minute. Thus, a crystal grain having a layered structure in which the first layer and the second layer are stacked alternately is grown to form the hard layer. In the formation condition "1A", the first gas group includes H$_2$ gas as the remainder in addition to TiCl$_4$ gas and AlCl$_3$ gas, as shown in Table 3. The second gas group includes a predetermined amount (volume %) of NH$_3$ gas and Ar gas as shown in Table 3.

In the formation conditions 1B to 1H and 2A to 2H, the flow rate of TiCl$_4$ or AlCl$_3$ was modulated in the same manner as in the "1A" above, and the hard layer was formed under the conditions shown in Table 3 or Table 4. Also for the formation conditions X and Y, the hard layer was formed under the conditions shown in Table 5.

In the formation conditions 1A, 1F, and 1G and the formation conditions 2A, 2E, and 2G, a crystal grain having a layered structure of the first layer and the second layer of nitride of AlTi was grown. In the formation conditions 1B to 1E, and 1H and the formation conditions 2B to 2D, 2F, and 2H, since the first gas group includes ethylene gas in the volume % as shown in Table 3 and Table 4, a crystal grain having a layered structure of the first layer and the second layer of carbonitride of AlTi was grown.

The hard layer formed under each condition is formed of crystal grains grown to have a layered structure in which the first layer and the second layer are alternately stacked in the stacking cycle as shown in Table 6 to Table 8. Table 6 to Table 8 also show the thickness of the first layer and the thickness of the second layer formed under each condition, the atomic ratio x of Al (largest value) in the first layer, the atomic ratio y of Al (smallest value) in the second layer, the difference (x-y) between the atomic ratio x (largest value) and the atomic ratio y (smallest value), the proportion of the length of Σ3 grain boundaries to the length of Σ3-29 grain boundaries (in Tables 6 to 8, denoted by "Σ3 length/Σ3-29 length (%)"), the proportion to the total length of all boundaries that is the sum of the length of Σ3-29 grain boundaries and the length of general boundaries (in Tables 6 to 8, denoted by "Σ3 length/all boundaries total length (%)"), and the proportion A and the proportion B that are the angle of intersection frequencies of the crystal grains included in the hard layer.

TABLE 6

| Formation condition | Atomic ratio x (max) | Atomic ratio y (min) | Difference x − y (max) | First layer (nm) | Second layer (nm) | Stacking cycle (nm) | Σ3 length/ Σ3-29 length (%) | Σ3 length/ all boundaries total length (%) | Proportion A (%) | Proportion B (%) |
|---|---|---|---|---|---|---|---|---|---|---|
| 1A | 0.95 | 0.62 | 0.33 | 3 | 2 | 5 | 55 | 12 | 57 | 40 |
| 1B | 0.95 | 0.62 | 0.33 | 10 | 6 | 16 | 90 | 10 | 72 | 58 |
| 1C | 0.95 | 0.62 | 0.33 | 14 | 9 | 23 | 95 | 15 | 70 | 55 |
| 1D | 0.90 | 0.60 | 0.30 | 5 | 3 | 8 | 69 | 13 | 68 | 52 |
| 1E | 0.90 | 0.60 | 0.30 | 10 | 6 | 16 | 85 | 11 | 71 | 55 |
| 1F | 0.85 | 0.58 | 0.27 | 4 | 3 | 7 | 55 | 20 | 65 | 49 |
| 1G | 0.85 | 0.58 | 0.27 | 9 | 6 | 15 | 57 | 30 | 70 | 53 |
| 1H | 0.80 | 0.57 | 0.23 | 8 | 6 | 14 | 77 | 27 | 66 | 58 |

TABLE 7

| Formation condition | Atomic ratio x (max) | Atomic ratio y (min) | Difference x − y (max) | First layer (nm) | Second layer (nm) | Stacking cycle (nm) | Σ3 length/ Σ3-29 length (%) | Σ3 length/ all boundaries total length (%) | Proportion A (%) | Proportion B (%) |
|---|---|---|---|---|---|---|---|---|---|---|
| 2A | 0.90 | 0.48 | 0.43 | 14 | 5 | 19 | 87 | 15 | 72 | 49 |
| 2B | 0.85 | 0.50 | 0.35 | 9 | 5 | 14 | 88 | 16 | 72 | 56 |
| 2C | 0.80 | 0.53 | 0.28 | 12 | 5 | 17 | 94 | 15 | 75 | 57 |
| 2D | 0.95 | 0.53 | 0.43 | 10 | 5 | 15 | 87 | 13 | 70 | 56 |
| 2E | 0.95 | 0.48 | 0.48 | 5 | 2 | 7 | 94 | 9 | 65 | 50 |
| 2F | 0.85 | 0.48 | 0.38 | 13 | 7 | 20 | 62 | 11 | 72 | 59 |
| 2G | 0.80 | 0.55 | 0.25 | 8 | 6 | 14 | 55 | 20 | 70 | 57 |
| 2H | 0.75 | 0.55 | 0.20 | 8 | 6 | 14 | 55 | 27 | 70 | 55 |

TABLE 8

| Formation condition | Atomic ratio x (max) | Atomic ratio y (min) | Difference x − y (max) | First layer (nm) | Second layer (nm) | Stacking cycle (nm) | Σ3 length/ Σ3-29 length (%) | Σ3 length/ all boundaries total length (%) | Proportion A (%) | Proportion B (%) |
|---|---|---|---|---|---|---|---|---|---|---|
| X | 0.90 | 0.75 | 0.15 | 5 | 12 | 17 | 75 | 33 | 30 | 10 |
| Y | 0.92 | — | — | — | — | — | 45 | 19 | 20 | 5 |

All of the crystal grains included in the hard layer formed under the formation conditions 1A to 1H and 2A to 2H had the sodium chloride-type crystal structure. All of the crystal grains included in the hard layer formed under the formation conditions X and Y had the sodium chloride-type crystal structure as well.

<<Production of Cutting Tool>>

Base material A or base material B prepared as described above was coated with a coating by the method as described above to produce cutting tools of Sample Nos. 1 to 36 as shown in Table 9. In the present examples, the cutting tools of Sample Nos. 1 to 32 are Examples, and the cutting tools of Sample Nos. 33 to 36 are Comparative Examples.

For example, according to Table 9, in the cutting tool of Sample No. 1, a 0.5 pm-thick TiN layer and a 2.5 μm-thick TiCN layer are stacked in this order on the surface of base material A to form an underlying layer. On the underlying layer, a 6.0 μm-thick hard layer is formed under the formation condition 1A. In the cutting tool of Sample No. 1, a surface coating layer ($Al_2O_3$ layer) is not formed on the hard layer. In the cutting tool of Sample No. 1, the thickness of the coating as a whole is 9.0 μm. In the cutting tool of Sample No. 1, the indentation hardness (GPa) exhibited by the hard layer is 34.3, and the compression residual stress (GPa) is 3.3.

TABLE 9

| Sample No. | Base material type | Underlying layer (μm) | Hard layer (μm) | Surface coating layer (μm) | Coating total thickness (μm) | Indentation hardness (GPa) | Residual stress (GPa) |
|---|---|---|---|---|---|---|---|
| 1 | A | TiN (0.5)-TiCN (2.5) | 1A (6.0) | — | 9.0 | 34.3 | 3.3 |
| 2 | A | TiN (0.5)-TiCN (2.5) | 1B(6.5) | $Al_2O_3$(1.0) | 10.5 | 35.5 | 3.1 |
| 3 | A | TiN (0.5)-TiCN (2.5) | 1C(7.2) | — | 10.2 | 38.0 | 2.8 |
| 4 | A | TiN (0.5)-TiCN (2.5) | 1D(5.5) | — | 8.5 | 34.0 | 4.0 |
| 5 | A | TiN (0.5)-TiCN (2.5) | 1E (6.0) | $Al_2O_3$(2.5) | 11.5 | 34.5 | 3.1 |
| 6 | A | TiN (0.5)-TiCN (2.5) | 1F (5.5) | — | 8.5 | 32.0 | 3.5 |
| 7 | A | TiN (0.5)-TiCN (2.5) | 1G (5.0) | — | 8.0 | 32.7 | 3.2 |
| 8 | A | TiN (0.5)-TiCN (2.5) | 1H (5.3) | — | 8.3 | 29.5 | 3.2 |
| 9 | B | TiN (1.0) | 1A (3.5) | — | 4.5 | 33.5 | 3.5 |
| 10 | B | TiN (1.0) | 1B (4.0) | $Al_2O_3$(2.2) | 7.2 | 35.0 | 3.0 |
| 11 | B | TiN (1.0) | 1C (5.0) | — | 6.0 | 37.0 | 2.5 |
| 12 | B | TiN (1.0) | 1D (4.5) | — | 5.5 | 34.2 | 3.8 |
| 13 | B | TiN (1.0) | 1E (3.7) | $Al_2O_3$(1.5) | 6.2 | 34.0 | 2.8 |
| 14 | B | TiN (1.0) | 1F (4.7) | — | 5.7 | 32.1 | 3.3 |
| 15 | B | TiN (1.0) | 1G (5.0) | — | 6.0 | 32.3 | 3.0 |
| 16 | B | TiN (1.0) | 1H (4.5) | — | 5.5 | 29.0 | 3.0 |
| 17 | A | TiN (0.5)-TiCN (2.5) | 2A (6.2) | — | 9.2 | 32.1 | 2.0 |
| 18 | A | TiN (0.5)-TiCN (2.5) | 2B (5.8) | — | 8.8 | 31.2 | 2.5 |
| 19 | A | TiN (0.5)-TiCN (2.5) | 2C (6.8) | $Al_2O_3$(1.3) | 11.1 | 31.0 | 2.4 |
| 20 | A | TiN (0.5)-TiCN (2.5) | 2D (5.9) | — | 8.9 | 33.5 | 2.6 |
| 21 | A | TiN (0.5)-TiCN (2.5) | 2E (7.0) | — | 10.0 | 31.9 | 3.8 |
| 22 | A | TiN (0.5)-TiCN (2.5) | 2F (4.8) | $Al_2O_3$ (2.2) | 10.0 | 31.3 | 2.4 |
| 23 | A | TiN (0.5)-TiCN (2.5) | 2G (4.6) | — | 7.6 | 31.2 | 2.0 |
| 24 | A | TiN (0.5)-TiCN (2.5) | 2H (4.4) | — | 7.4 | 30.3 | 1.8 |
| 25 | B | TiN (1.0) | 2A (4.0) | — | 5.0 | 32.0 | 2.5 |
| 26 | B | TiN (1.0) | 2B (3.5) | — | 4.5 | 31.4 | 2.5 |
| 27 | B | TiN (1.0) | 2C (4.0) | $Al_2O_3$(0.8) | 5.8 | 32.0 | 2.0 |
| 28 | B | TiN (1.0) | 2D (5.2) | — | 6.2 | 33.0 | 2.8 |
| 29 | B | TiN (1.0) | 2E (4.7) | — | 5.7 | 32.1 | 3.5 |
| 30 | B | TiN (1.0) | 2F (5.5) | $Al_2O_3$(1.7) | 8.2 | 32.5 | 2.0 |
| 31 | B | TiN (1.0) | 2G (4.8) | — | 5.8 | 29.2 | 2.5 |
| 32 | B | TiN (1.0) | 2H (5.2) | — | 6.2 | 29.0 | 2.0 |
| 33 | A | TiN (0.5)-TiCN (2.5) | X (5.5) | — | 8.5 | 28.5 | 1.4 |
| 34 | A | TiN (0.5)-TiCN (2.5) | Y (6.0) | — | 9.0 | 41.5 | 0.3 |
| 35 | B | TiN (1.0) | X (4.5) | — | 5.5 | 28.0 | 1.6 |
| 36 | B | TiN (1.0) | Y (3.8) | — | 4.8 | 40.6 | 0.4 |

In the cutting tools of Sample Nos. 1 to 36, any of the base material, the underlying layer, and the hard layer differ among samples. In Table 9, in the case where two compounds are listed in one field (for example, "TiN(0.5)-TiCN (2.5)"), the compound on the left ("TiN(0.5)") means the layer positioned on the side closer to the surface of the base material, and the compound on the right ("TiCN(2.5)") means the layer positioned on the side farther from the surface of the base material. The numerical value in brackets means the thickness of each layer. The field showing "-" in Table 9 means that no layer is present. Table 9 also shows the values of indentation hardness and compression residual stress of the hard layer in the cutting tools of Sample Nos. 1 to 36.

<<Cutting Test>>

Two kinds of cutting tests below were conducted using the cutting tools of Sample Nos. 1 to 36 produced as described above.

<Rod Exterior High-Speed Cutting Test>

For the cutting tools of Sample Nos. 1 to 8, 17 to 24, 33, and 34, the cutting time taken for the amount of flank wear (Vb) to reach 0.20 mm was measured under the cutting conditions below, and the ultimate damage state of the cutting edge was observed to evaluate the tool life. The results are shown in Table 10. The cutting tool with a longer cutting time is regarded as excellent in wear resistance and is likely to achieve a long life even with high-speed cutting.

(Cutting Conditions for Rod Exterior High-Speed Cutting Test)

Cut material: FCD450 rod
Circumferential speed: 500 m/min

Feeding speed: 0.15 mm/rev
Cut amount: 1.0 mm
Cutting fluid: present
<Block Material Loss-Resistance Test>
For the cutting tools of Sample Nos. 9 to 16, 25 to 32, 35, and 36, the cutting distance taken for the amount of flank wear (Vb) to reach 0.20 mm was measured under the cutting conditions below, and the ultimate damage state of the cutting edge was observed to evaluate the tool life. The results are shown in Table 11. The cutting tool with a longer cutting distance is regarded as excellent in chipping resistance and is likely to achieve a long life, irrespective of the kinds of cut material.
(Cutting Conditions in Block Material Loss-Resistance Test)
Cut material: SUS304 block material
Circumferential velocity: 250 m/min
Feeding speed: 0.3 mm/s
Cut amount: 2.0 mm
Cutting fluid: none
Cutter: WGC416OR (manufactured by SUMITOMO ELECTRIC HARDMETAL CORP.)

TABLE 10

| Sample No. | Cutting time (min) | Ultimate damage state |
|---|---|---|
| 1 | 21 | wear |
| 2 | 25 | Wear |
| 3 | 30 | wear |
| 4 | 18 | wear |
| 5 | 21 | wear |
| 6 | 16 | wear |
| 7 | 16 | wear |
| 8 | 15 | wear |
| 17 | 30 | wear |
| 18 | 23 | wear |
| 19 | 23 | wear |
| 20 | 28 | wear |
| 21 | 35 | wear |
| 22 | 21 | wear |
| 23 | 14 | wear |
| 24 | 11 | wear |
| 33 | 8 | chipping |
| 34 | 6 | chipping |

TABLE 11

| Sample No. | Cutting distance (km) | Ultimate damage state |
|---|---|---|
| 9 | 9.6 | wear |
| 10 | 11.4 | wear |
| 11 | 9.0 | wear |
| 12 | 9.4 | wear |
| 13 | 9.0 | wear |
| 14 | 9.3 | wear |
| 15 | 8.0 | wear |
| 16 | 6.7 | wear |
| 25 | 9.6 | wear |
| 26 | 7.6 | wear |
| 27 | 7.7 | wear |
| 28 | 12.2 | wear |
| 29 | 14.1 | wear |
| 30 | 13.9 | wear |
| 31 | 7.5 | wear |
| 32 | 6.7 | wear |
| 35 | 5.0 | chipping |
| 36 | 4.5 | loss |

In Table 10 and Table 11, the description in the "ultimate damage state" field indicates that wear resistance of the coating is inferior in the order of: wear, chipping, and loss. "Wear" means a damage state including wear alone (having a smooth worn surface) without chipping and chips. "Chipping" means minute chips in the cutting blade of the cutting tool for producing a finished surface. "Loss" means a large chip produced in the cutting blade.
<Evaluation>
According to Table 10, the cutting tools of Sample Nos. 1 to 8 and 17 to 24 were found to have a long life compared with the cutting tools of Sample Nos. 33 and 34. In particular, the cutting tools of Sample Nos. 33 and 34 were found to have chipping and be inferior in performance for high-speed cutting.
According to Table 11, the cutting tools of Sample Nos. 9 to 16 and 25 to 32 were found to have a long life compared with the cutting tools of Sample Nos. 35 and 36. In particular, the cutting tool of Sample No. 35 was found to have chipping and the cutting tool of Sample No. 36 was found to have a loss and be inferior in chipping resistance performance (loss resistance performance).

Although embodiments and examples of the present invention have been described above, it is initially intended that the configurations of the foregoing embodiments and examples are combined as appropriate.

It should be understood that the embodiments and examples disclosed herein are illustrative but not limiting in all respects. The scope of the present invention is shown not in the foregoing description but in the claims, and it is intended that all modifications that come within the meaning and range of equivalence to the claims are embraced here.

DESCRIPTION OF THE REFERENCE SIGNS

10 base material, 20 coating, 21 base material-holding jig, 22 reaction chamber, 23 temperature regulating device, 24 first gas introducing pipe, 25 second gas introducing pipe, 26 axis, 27 gas exhaust pipe, 28 gas exhaust port, 100 CVD system.

The invention claimed is:

1. A surface-coated cutting tool comprising a base material and a coating formed on said base material,
said coating including a hard layer,
said hard layer including a plurality of crystal grains having a sodium chloride-type crystal structure, wherein
when crystal orientation of each of said plurality of crystal grains is analyzed using an electron backscatter diffraction system for a cross section of said hard layer that is parallel to a normal direction of a surface of said base material to measure an angle of intersection between a normal direction to (001) plane that is a crystal plane of said crystal grain and the normal direction to the surface of said base material, a proportion A of said crystal grains having said angle of intersection of 0 degree or more to less than 20 degrees is 50% or more,
boundaries of said crystal grains include CSL boundaries and general boundaries,
the length of Σ3 grain boundaries of said CSL boundaries is 50% or more of the length of Σ3-29 grain boundaries that is a total of respective lengths of Σ3 grain boundaries, Σ7 grain boundaries, Σ11 grain boundaries, Σ17 grain boundaries, Σ19 grain boundaries, Σ21 grain boundaries, Σ23 grain boundaries, and Σ29 grain boundaries included in said CSL boundaries and is 1% or more and 30% or less of the total length of all boundaries that is a sum of the length of said Σ3-29 grain boundaries and the length of said general boundaries, said crystal grain has a layered structure in which a first layer composed of nitride or carbonitride of $Al_xTi_{1-x}$ and a second layer composed of nitride or carbonitride of $Al_yTi_{1-y}$ (where x≠y) are alternately stacked, and a total thickness of said first layer and said second layer adjacent to each other is 3 nm or more and 30 nm or less, when the composition of the first layer is nitride, the composition of the second layer is also nitride, and when the composition of the first layer is carbonitride, the composition of the second layer is also carbonitride.

2. The surface-coated cutting tool according to claim 1, wherein a proportion B of said crystal grains having said angle of intersection of 10 degrees or more to less than 20 degrees is 30% or more.

3. The surface-coated cutting tool according to claim 1, wherein said hard layer has a thickness of 1 μm or more and 15 μm or less.

4. The surface-coated cutting tool according to claim 1, wherein said hard layer has an indentation hardness by nanoindentation of 28 GPa or more and 38 GPa or less.

5. The surface-coated cutting tool according to claim 1, wherein said hard layer has an absolute value of compression residual stress of 0.5 GPa or more and 5.0 GPa or less.

6. A method of producing the surface-coated cutting tool of claim 1, the method comprising:

a first step of preparing said base material; and a second step of forming said hard layer by chemical vapor deposition, said second step including a step of growing said crystal grains while modulating a flow rate of both or one of $AlCl_3$ gas and $TiCl_4$ gas.

* * * * *